United States Patent
Kavipurapu et al.

(10) Patent No.: US 7,301,367 B1
(45) Date of Patent: Nov. 27, 2007

(54) METHOD AND APPARATUS FOR PROVIDING A SCHEDULER SELECT MULTIPLEXER

(75) Inventors: Gautam Nag Kavipurapu, Sunnyvale, CA (US); Jack Lo, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 103 days.

(21) Appl. No.: 11/250,944

(22) Filed: Oct. 14, 2005

(51) Int. Cl.
*H03K 19/173* (2006.01)

(52) U.S. Cl. .............................. 326/37; 326/38; 326/41

(58) Field of Classification Search ............ 326/37–41, 326/47; 370/395, 395.42, 395.43, 535, 537
See application file for complete search history.

(56) References Cited

U.S. PATENT DOCUMENTS 6,396,853 B1 * 5/2002 Humphrey et al. ......... 370/535
2003/0058869 A1 * 3/2003 Novick .................. 370/395.43

OTHER PUBLICATIONS

Harteros, Kostas G.I., "Fast Parallel Comparison Circuits for Scheduling", Technical Report Forth-ICS/TR-304, Inst. of Computer Science, Forth, Heraklio, Crete, Greece; M. Sc. Thesis, Univ. http://archvlsi.forth.gr/muqpro/heapMgt.html.

Ioannou, A.; Katevenis, M., "Pipelined Heap (Priority Queue) Management for Advanced Scheduling in High Speed Networks", Proc. IEEE Int. Conf. on Communications (ICCC'2001), Helsinki, Finland, Jun. 2001, pp. 2043-2047; http://archvlsi.ics.forth.gr/muqpro/heapMgt.html.

* cited by examiner

*Primary Examiner*—Anh Q. Tran
(74) *Attorney, Agent, or Firm*—Robert Brush

(57) ABSTRACT

Method and apparatus for providing a scheduler select multiplexer is described. In one example, a multiplexer is provided having a plurality of input ports in respective communication with a plurality of queues, an output port, and a select port. A scheduler is provided to execute a scheduling algorithm to periodically generate a schedule comprising a set of entries. Each of the entries comprises at least one bit for controlling the select port of the multiplexer. A memory is provided to store the schedule. For each of a plurality of clock cycles, the select port of the multiplexer is driven with one of the entries such that the multiplexer sends data from one of the plurality of queues to the output port.

20 Claims, 4 Drawing Sheets

METHOD AND APPARATUS FOR PROVIDING A SCHEDULER SELECT MULTIPLEXER

FIELD OF THE INVENTION

One or more aspects of the present invention relate generally to digital logic circuits and, more particularly, to a method and apparatus for providing a scheduler select multiplexer.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

Presently, real time schedulers designs for en-queuing and de-queuing packets, cells, frames, etc. from a memory sub-system are implemented using hardwired circuitry. A weighted round robin scheduler, for example, requires the calculation of the weights while the data is received from the input queues and implementation of a token-based leaky bucket structure to regulate the data flow to the output of the scheduler. This requires the hardwired logic implementing the scheduler to run at frequencies that are several magnitudes higher than the data rate, making such designs impractical to be implemented using a PLD. Accordingly, present scheduling and queuing implementations are application specific integrated circuit (ASIC) solutions, with the ASIC running at more than several hundred megahertz (MHz) and having more than five million gates per design.

Accordingly, there exists a need in the art for a scheduler select multiplexer capable of implementation using a PLD.

SUMMARY OF THE INVENTION

Method and apparatus for providing a scheduler select multiplexer is described. In one embodiment, a multiplexer is provided having a plurality of input ports in respective communication with a plurality of queues, an output port, and a select port. A scheduler is provided to execute a scheduling algorithm to periodically generate a schedule comprising a set of entries. Each of the entries comprises at least one bit for controlling the select port of the multiplexer. A memory is provided to store the schedule. For each of a plurality of clock cycles, the select port of the multiplexer is driven with one of the entries such that the multiplexer sends data from one of the plurality of queues to the output port.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for providing a scheduler select multiplexer is described. One or more aspects of the invention are described with respect to a logic circuit configured in a field programmable gate array (FPGA) and a processor embedded in the FPGA. Those skilled in the art will appreciate that the invention may be employed with other types of integrated circuits, such as complex programmable logic devices (CPLDs), application specific integrated circuits (ASICs), and the like. In addition, those skilled in the art will appreciate that the invention may be used with discrete logic circuitry and a discrete processor.

Figure 1:
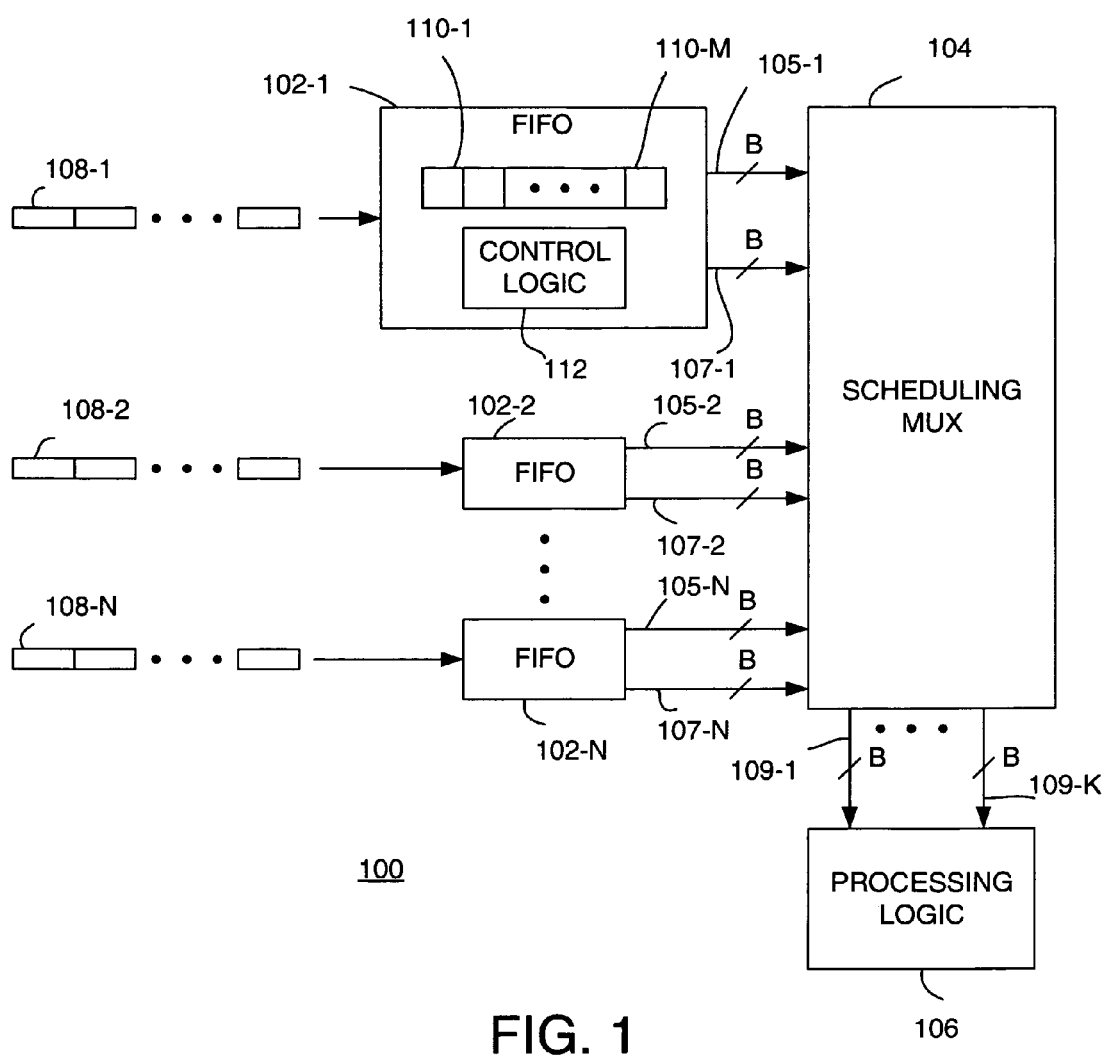
FIG. 1 is a block diagram depicting an exemplary embodiment of a data management system constructed in accordance with one or more aspects of the invention.

FIG. 1 is a block diagram depicting an exemplary embodiment of a data management system 100 constructed in accordance with one or more aspects of the invention. The system 100 includes a set of first-in-first-out circuits (FIFOs) 102-1 through 102-N (collectively referred to as FIFOs 102), a scheduling multiplexer (MUX) 104, and data processing logic 106. Briefly stated, data to be processed is stored in the FIFOs 102 and is selected therefrom by the scheduling MUX 104 for processing by the processing logic 106. The data to be processed comprises streams of packets (e.g., internet protocol (IP) packets), cells (e.g., asynchronous transfer mode (ATM) cells), frames (e.g., Ethernet frames), or the like. For purposes of clarity by example, the data to be processed by the system 100 is described as a set of packet streams. It is to be understood that the term "packet" is being used in the general sense and does not imply a specific protocol. The system 100 may be implemented within a PLD, such as the FPGA 400 shown in FIG. 4 below.

The FIFOs 102 are respectively coupled to the scheduling MUX 104 by data paths 105-1 through 105-N (collectively referred to as data paths 105). Each of the data paths 105 has a width of B bits. In addition, the FIFOs 102 are respectively coupled to the scheduling MUX 104 by control paths 107-1 through 107-N (collectively referred to as control paths 107). Each of the control paths 107 has a width of one or more bits. The scheduling MUX 104 is coupled to the data processing logic 106 by data paths 109-1 through 109-K (data paths 109). Each of the data paths 109 has a width of B bits.

In particular, the FIFOs 102-1 through 102-N respectively receive packet streams 108-1 through 108-N (collectively referred to as packet streams 108). The packets in each of the packets streams 108 include one or more data words, where each data word comprises B bits or B/8 bytes. Notably, the size in bytes of the packets in one of the packet streams 108 may be different than the size in bytes of the packets in another of the packet streams 108. Each of the FIFOs 102 includes control logic 112 and memory locations 110-1 through 110-M (collectively referred to as memory locations 110). For clarity, only the FIFO 102-1 is shown in detail. Each of the memory locations 110 is configured to store a data word (i.e., the size in bits of each entry is equivalent to the width (B) of the data paths 105). That is, each of the FIFOs 102 has a "depth" of M and a "width" of B, where M and B are positive integers. The control logic 112 is configured to push data into the FIFO, pop data from the FIFO, and generate various types of status data, such as whether the FIFO is full or almost full, whether the FIFO is empty or almost empty, and like type FIFO status flags and signals known in the art. Data words popped from the FIFOs 102 are provided to the scheduling MUX 104 via the data paths 105. Status data for the FIFOs 102 is provided to the scheduling MUX 104 via the control paths 107.

The scheduling MUX 104 selects data from the N data paths 105 onto the K data paths 109 in accordance with a scheduling algorithm, where K and N are positive integers. The scheduling algorithm may comprise a round robin (RR) algorithm, a weighted round robin (WRR) algorithm, a weighted fair queuing (WFQ) algorithm, or like type scheduling algorithm known in the art. The scheduling algorithm may use status data from the FIFOs 102 as parametric input to generate a multiplexing schedule. An exemplary embodiment of the scheduling MUX 104 is described below with respect to FIG. 2. The processing logic 106 is configured to process the data selected by the scheduling MUX 104.

Figure 2:
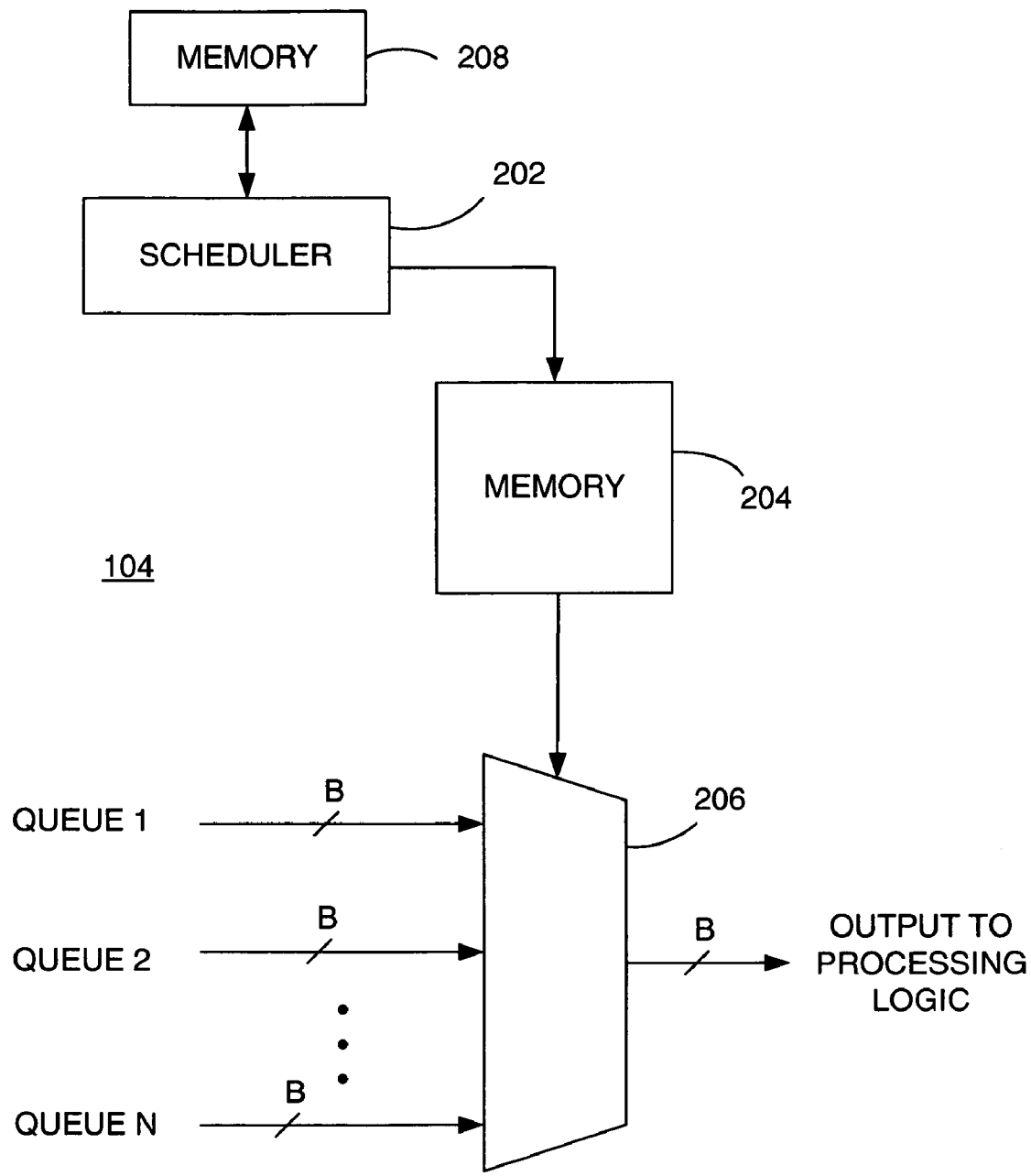
FIG. 2 is a block diagram depicting an exemplary embodiment of a scheduling multiplexer of FIG. 1 constructed in accordance with one or more aspects of the invention.

FIG. 2 is a block diagram depicting an exemplary embodiment of the scheduling MUX 104 constructed in accordance with one or more aspects of the invention. In one embodiment, the scheduling MUX 104 includes a scheduler 202, a memory 204, and a multiplexer 206. In one embodiment, the memory 204 comprises a dual-port memory, such as a dual-port random access memory (RAM). The memory 204 is operated synchronously in accordance with a clock signal (CLK). The scheduler 202 may comprise specific logic, a processor (e.g., general purpose, such as an IBM POWER PC, or specific purpose, such as a microcontroller), or a combination of specific logic and a processor. The scheduler 202 is also operated synchronously in accordance with the clock signal CLK.

A memory interface of the scheduler 202 is coupled to a first port of the memory 204. A select port of the multiplexer 206 is coupled to a second port of the memory 204. Data input ports of the multiplexer 206 have access to queues of packets from the FIFOs 102-1 through 102-N, respectively. A data output port of the multiplexer 206 provides data to the processing logic 206. For purposes of clarity by example, the multiplexer 206 is shown as having a single data output port. It is to be understood that the multiplexer 206 may have more than one data output port, as shown above in FIG. 1. In addition, although the memory 204 is described as a dual port memory, it is to be understood that the memory 204 may be configured with a single port to which access is arbitrated among the scheduler 202 and the multiplexer 206, such an arbitration process being well-known in the art.

In operation, the scheduler 202 is configured with a scheduling algorithm. In one embodiment, an input/output (I/O) interface of the scheduler 202 is coupled to a memory 208. The memory 208 may comprise a nonvolatile memory, such as FLASH memory, electronically erasable programmable read only memory (EEPROM), and the like. Various scheduling algorithms are stored in the memory 208 for dynamic selection by the scheduler 202. In another embodiment, the scheduling algorithm implemented by the scheduler 202 is statically selected at the time of design. The scheduling algorithm implemented by the scheduler 202 may be, for example, an RR algorithm, a WRR algorithm, a WFQ algorithm, and like scheduling algorithms known in the art.

The scheduler 202 periodically generates a schedule in accordance with a processing cycle via execution of the scheduling algorithm. Control data from the FIFOs 102 is provided as parametric input to the scheduling algorithm to produce a schedule every processing cycle. The control data includes FIFO status (e.g., almost full, almost empty, etc.), class of traffic (e.g., attributes of the packets in each of the FIFOs, such as priority attributes), and the like. The schedule controls the distribution of data words in the FIFOs 102 to the output port of the multiplexer 206.

In particular, the schedule comprises a set of bits that form the select signal for the multiplexer 206 for every clock cycle. Notably, the schedule comprises a set of entries. The size of each entry depends on the number of bits required at the selection port of the multiplexer 206. For example, the size of each entry may be N bits wide (i.e., the number of input terminals to the multiplexer 206) or $\log_2(N)$ bits wide (i.e., binary coded selection). The scheduler 202 loads the schedule into the memory 204. The number of entries in the schedule comprises the scheduling cycle. The time period of the scheduling cycle ("scheduling cycle period") is the number of entries in the schedule multiplied by the frequency of the clock signal CLK. The scheduling cycle is dictated by the data rate on each queue (if each queue has the same data rate) or the fastest data rate (if the queues have different data rates). Notably, the scheduling cycle is a function of the depth of each of the FIFOs 102 and the data rate.

If the schedule is to be dynamically adjusted every scheduling cycle, then a new schedule must be generated during the scheduling cycle period. That is, the processing cycle and the scheduling cycle of the same. In some cases, it is not necessary to dynamically adjust the schedule every scheduling cycle. Thus, the processing cycle may be longer than the scheduling cycle (i.e., the schedule may be in place for multiple scheduling cycles). As discussed below, the processing cycle period dictates the bandwidth requirement for the memory 204.

In one embodiment, the memory 204 may be configured as a FIFO, with the first entry of the schedule being at the head of the FIFO and the last entry of the schedule being at the tail of the FIFO. The multiplexer 206 pops the entries from the memory 204 on a clock-by-clock basis to generate a select signal every clock cycle. For every clock cycle, the multiplexer 206 sends a data word from one of the N input ports to the output port. Notably, if the multiplexer 206 has K output ports, than the multiplexer 206 sends data words from K of the N input ports to the K output ports every clock cycle.

Operation of the scheduling MUX 104 may be understood with reference to the following example. In one embodiment, the scheduler 202 implements a RR algorithm with three input queues (N=3). In the RR algorithm, a complete packet is repeatedly sent from each queue in succession (i.e., a packet from queue 1, a packet from queue 2, a packet from queue 3, a packet from queue 1, a packet from queue 2, and so forth). Assume that all the data paths and the entries in the FIFOs 102 are two bytes (B=16 bits). The packet sizes for the first, second, and third queues are 30 bytes (15 data words), 40 bytes (20 data words), and 64 (32 data words) bytes respectively. The data rate on each queue may be the same, such data rate being used to set the scheduling cycle. Alternatively, the fastest data rate may be used to set the scheduling cycle. Assuming the fastest data rate is 1 gigabits per second (Gbps), the duration of the scheduling cycle is a function of the depth of each FIFO and the input data rate. The number of entries in the schedule is the sum of the number of 2-byte entries in queue 1, the number of 2-byte entries in queue 2, and the number of 2-byte entries in queue 3. In the present example, the number of entries in the schedule is:

$$\frac{30}{2} + \frac{40}{2} + \frac{64}{2} = 67 \text{ entries.}$$

The scheduler 202 fills the memory 204 with the following entries for a 2-bit wide entry (i.e., binary coded selection for the multiplexer 206):

Entry 1: 01

Entry 2: 01

. . .

Entry 15: 01

Entry 16: 10

Entry 17: 10

. . .

Entry 35: 10

Entry 36: 11

Entry 37: 11

. . .

Entry 67: 11

Alternatively, for three-bit wide entries, the scheduler 202 fills the memory 204 with the following entries:

Entry 1: 001

Entry 2: 001

. . .

Entry 15: 001

Entry 16: 010

Entry 17: 010

. . .

Entry 35: 010

Entry 36: 100

Entry 37: 100

. . .

Entry 67: 100

In the above example, the scheduling cycle period is calculated to be:

$$\frac{(30 + 40 + 64) \times 8 \text{ bits}}{1 \text{ Gbps}} = 1 \text{ microsecond}$$

This is effectively the arrival rate of one packet across all queues. Thus, in the case with the processing cycle is equal to the scheduling cycle, the scheduler 202 must generate a set of 67 entries every one microsecond. The memory bandwidth required to fill the entries of the schedule is then (for 2-bit entries):

$$\frac{(67 * 2)}{1 \text{ microsecond}} = 400 \text{ Mbps.}$$

One microsecond is more than enough for a WFQ, WRR, or RR type scheduling algorithm to run in firmware on a processor, for example.

In most cases, the schedule does not have to be dynamically adjusted every packet. Thus, the granularity of the processing cycle may be increased (i.e., longer than a scheduling cycle), requiring less memory bandwidth. For example, if the processing cycle period is 10 microseconds, then the memory bandwidth is reduced by a factor of 10 to 40 Mbps. This is typical of a case where the network flows have the same priority for the duration of a session, where a certain kind of data is exchanged for a certain period of time.

Figure 3:
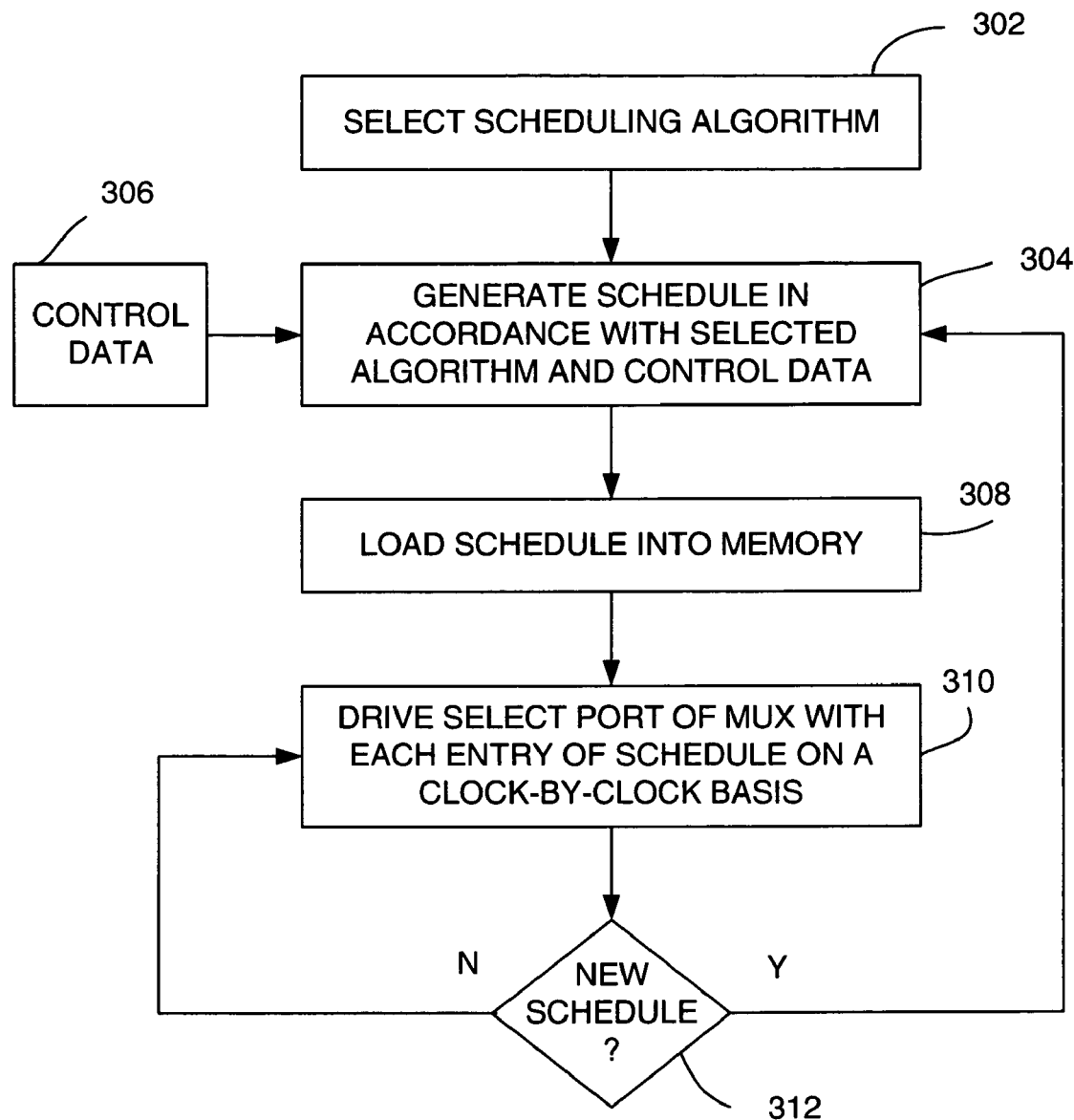
FIG. 3 is a flow diagram depicting an exemplary embodiment of a method of operation of the scheduling MUX of FIG. 2 in accordance with one or more aspects of the invention.

FIG. 3 is a flow diagram depicting an exemplary embodiment of a method 300 of operation of the scheduling MUX 104 in accordance with one or more aspects of the invention. The method 300 begins at step 302, where a scheduling algorithm is selected. At step 304, a schedule is generated comprising a set of entries in accordance with the scheduling algorithm selected at step 302 and control data received at step 306. At step 308, the schedule is loaded into the memory 204. At step 310, the select port of the multiplexer 206 is driven with each entry of the schedule on a clock-by-clock basis. At step 312, a determination is made whether a new schedule should be generated. If not, the method 300 returns to step 310. Otherwise, the method 300 returns to step 304.

Figure 4:
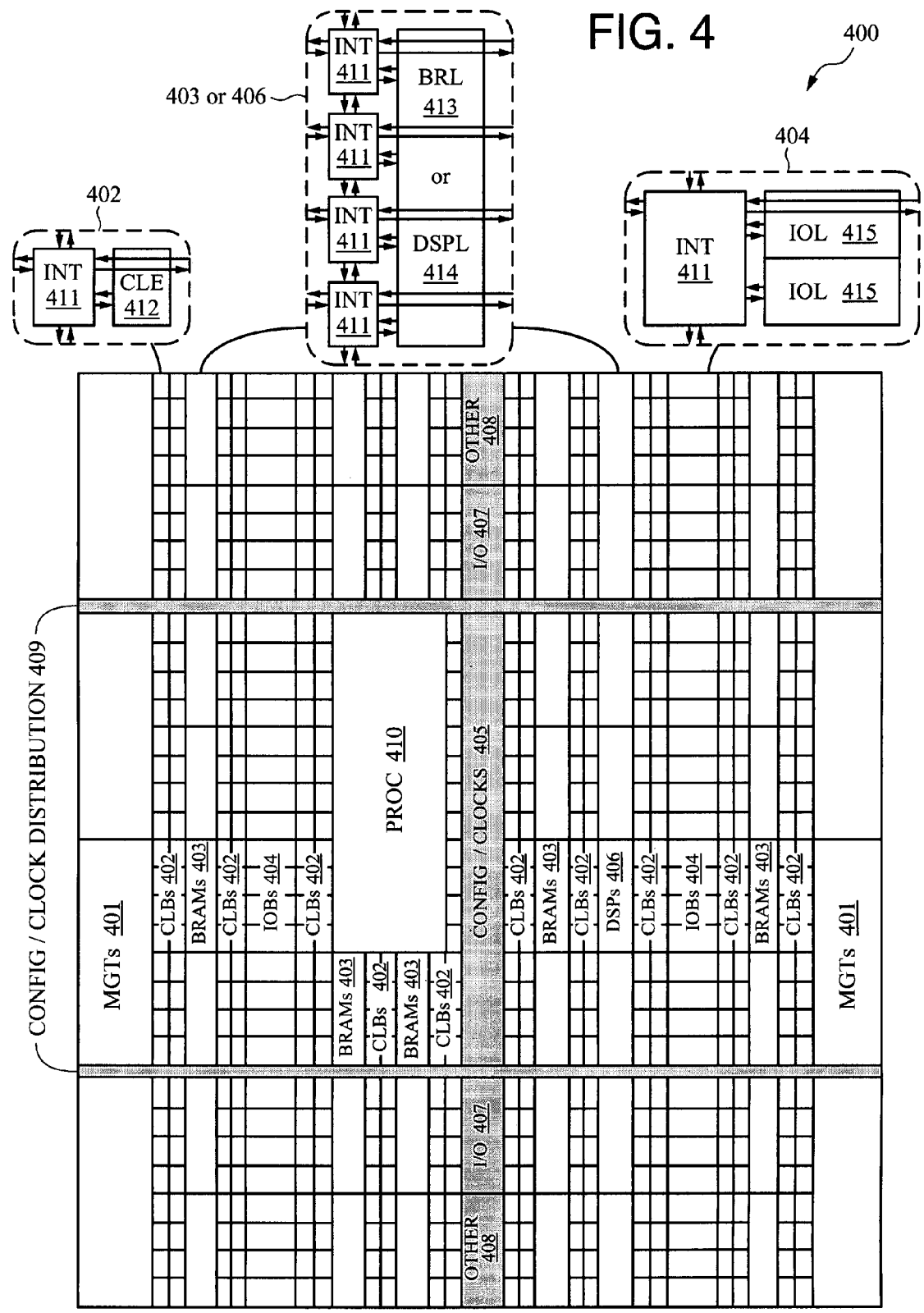
FIG. 4 illustrates an FPGA architecture in accordance with one or more aspects of the invention.

FIG. 4 illustrates an FPGA architecture 400 that includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407) (e.g., configuration ports and clock ports), and other programmable logic 408 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 402 can include a configurable logic element (CLE 412) that can be programmed to implement user logic plus a single programmable interconnect element (INT 411). A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element (INT 411). As will be clear to those of skill in the art, the actual I/O pads connected, for example, to the I/O logic element 415 are manufactured using metal layered above the various illustrated logic blocks, and typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

The processor block PROC 410 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs 402, IOBs 404, etc.). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic.

Returning to FIG. 2, the scheduling MUX 104 may be implemented using configurable logic, dedicated logic, or a combination of configurable and dedicated logic in the FPGA 400. Notably, the scheduler 202 may comprise configurable logic, an embedded processor, or a combination of configurable logic and an embedded processor. The memory 204 may comprise BRAM. The multiplexer 206 may be implemented using configurable logic, dedicated logic, or a combination thereof.

Method and apparatus for providing a scheduler select multiplexer has been described. In one embodiment, a scheduling MUX includes a scheduler, a memory, and a multiplexer. The scheduling MUX is configured to select K data lines to be output from N input lines. Each data line is of variable width (bus). The data that is carried on the data lines is in cell/packet/frame form with cell/packet/frame delimeters. The numbers K, N, the size of the cells/packets/frames, and the bus/data line width may be selected as desired for a given design. The multiplexer is controlled by a schedule that is generated by the scheduler (a processor or logic block) that executes a scheduling algorithm. The scheduler fills the memory with entries that form the schedule. The entries are read on a clock-by-clock basis to generate the select input to the multiplexer every clock cycle. The size of each entry in the memory depends on the selection scheme employed by the multiplexer (N or $\log_2(N)$). The number of entries in the schedule constitutes a scheduling cycle. A single scheduling cycle period is the number of entries multiplied by the clock frequency. The scheduling algorithms being run on the scheduler can be loaded dynamically from a nonvolatile memory or can be statically selected at design time.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed:

1. Apparatus for processing data from a plurality of queues, comprising:
   a multiplexer having a plurality of input ports in respective communication with the plurality of queues, an output port, and a select port;
   a scheduler configured to execute a scheduling algorithm to periodically generate a schedule comprising a set of entries, each of the entries comprising at least one bit for controlling the select port of the multiplexer; and
   a memory for storing the schedule and, for each of a plurality of clock cycles, driving the select port with one of the entries such that the multiplexer sends data from one of the plurality of queues to the output port.

2. The apparatus of claim 1, further comprising:
   another memory for storing at least one scheduling algorithm;
   wherein the scheduler is in communication with the other memory and the scheduling algorithm implemented therein is selected from the at least one scheduling algorithm.

3. The apparatus of claim 2, wherein the other memory comprises a nonvolatile memory.

4. The apparatus of claim 2, wherein the at least one scheduling algorithm comprises a round robin algorithm, a weighted round robin algorithm, and a weighted fair queuing algorithm.

5. The apparatus of claim 1, wherein the scheduler comprises at least one of: (a) dedicated logic; (b) a general-purpose processor; or (c) a specific-purpose processor.

6. The apparatus of claim 1, wherein the memory comprises a dual-port random access memory (RAM) having a first port coupled to the scheduler and a second port coupled to the select port of the multiplexer.

7. The apparatus of claim 6, wherein the memory is configured as a first-in-first-out memory (FIFO), wherein a first entry in the set of entries is stored at a head of the FIFO and a last entry in the set of entries is stored at a tail of the FIFO.

8. The apparatus of claim 1, wherein the multiplexer, the scheduler, and the memory are implemented using configurable logic, dedicated logic, or a combination of configurable logic and dedicated logic in a programmable logic device (PLD).

9. A data management system, comprising:
a plurality of first-in-first-out circuits (FIFOs);
processing logic for processing data stored in the FIFOs; and
a scheduling multiplexer, comprising:
   a multiplexer having a plurality of input ports in respective communication with the plurality of FIFOs, an output port in communication with the processing logic, and a select port;
   a scheduler configured to execute a scheduling algorithm to periodically generate a schedule comprising a set of entries, each of the entries comprising at least one bit for controlling the select port of the multiplexer; and
   a memory for storing the schedule and, for each of a plurality of clock cycles, driving the select port with one of the entries such that the multiplexer sends data from one of the plurality of queues to the output port.

10. The system of claim 9, wherein the scheduling multiplexer comprises:
another memory for storing at least one scheduling algorithm;
wherein the scheduler is in communication with the other memory and the scheduling algorithm implemented therein is selected from the at least one scheduling algorithm.

11. The system of claim 10, wherein the other memory comprises a nonvolatile memory.

12. The system of claim 10, wherein the at least one scheduling algorithm comprises a round robin algorithm, a weighted round robin algorithm, and a weighted fair queuing algorithm.

13. The system of claim 9, wherein the scheduler comprises at least one of: (a) dedicated logic; (b) a general-purpose processor; or (c) a specific-purpose processor.

14. The system of claim 9, wherein the memory comprises a dual-port random access memory (RAM) having a first port coupled to the scheduler and a second port coupled to the select port of the multiplexer.

15. The system of claim 14, wherein the memory is configured as a first-in-first-out memory (FIFO), wherein a first entry in the set of entries is stored at a head of the FIFO and a last entry in the set of entries is stored at a tail of the FIFO.

16. The system of claim 9, wherein the scheduling multiplexer is implemented using configurable logic, dedicated logic, or a combination of configurable logic and dedicated logic in a programmable logic device (PLD).

17. A method for processing data from a plurality of queues, comprising:
providing a multiplexer having a plurality of input ports in respective communication with the plurality of queues, an output port, and a select port;
selecting a scheduling algorithm;
generating a schedule comprising a plurality of entries in accordance with the scheduling algorithm, each of the entries comprising at least one bit for controlling the select port of the multiplexer;
storing the schedule in a memory; and
for each of a plurality of clock cycles, driving the select port of the multiplexer with one of the entries such that the multiplexer sends data from one of the plurality of queues to the output port.

18. The method of claim 17, wherein the scheduling algorithm comprises one of a round robin algorithm, a weighted round robin algorithm, and a weighted fair queuing algorithm.

19. The method of claim 17, wherein the memory is configured as a first-in-first-out memory (FIFO), wherein a first entry in the plurality of entries is stored at a head of the FIFO and a last entry in the plurality of entries is stored at a tail of the FIFO.

20. The method of claim 17, repeating the steps of generating, storing, and driving a plurality of times.

* * * * *